United States Patent
Kusano et al.

(10) Patent No.: US 9,618,584 B2
(45) Date of Patent: Apr. 11, 2017

(54) BATTERY CONTROL DEVICE

(71) Applicant: DENSO CORPORATION, Kariya, Aichi-pref. (JP)

(72) Inventors: Yoshikazu Kusano, Aichi-ken (JP); Hisashi Umemoto, Tokai (JP); Naomi Awano, Nagoya (JP); Manabu Yamada, Okazaki (JP)

(73) Assignee: DENSO CORPORATION, Kariya (JP)

(*) Notice: Subject to any disclaimer, the term of this patent is extended or adjusted under 35 U.S.C. 154(b) by 224 days.

(21) Appl. No.: 14/563,032

(22) Filed: Dec. 8, 2014

(65) Prior Publication Data

US 2015/0160301 A1    Jun. 11, 2015

(30) Foreign Application Priority Data

Dec. 9, 2013   (JP) ................................ 2013-254548

(51) Int. Cl.
    *H02J 7/00*       (2006.01)
    *G01R 31/36*      (2006.01)
    *H02J 7/14*       (2006.01)

(52) U.S. Cl.
    CPC .......... *G01R 31/3624* (2013.01); *H02J 7/007* (2013.01); *H02J 7/0081* (2013.01); *H02J 7/14* (2013.01)

(58) Field of Classification Search
    CPC .... G01R 31/3624; H02J 7/0081; H02J 7/007; H02J 7/14; Y02T 10/7005
    See application file for complete search history.

(56) References Cited

U.S. PATENT DOCUMENTS 6,064,182 A * 5/2000 Eguchi ................ G01R 31/362
                                                    320/132
2003/0195719 A1   10/2003   Emori et al.
(Continued)

FOREIGN PATENT DOCUMENTS

JP     2003-303627     10/2003
JP     2009-512845     3/2009
(Continued)

OTHER PUBLICATIONS

Office Action (3 pages) dated Oct. 27, 2015, issued in corresponding Japanese Application No. 2013-254548 and English translation (4 pages).

*Primary Examiner* — Nha Nguyen
(74) *Attorney, Agent, or Firm* — Nixon & Vanderhye PC

(57) ABSTRACT

A battery control device calculates a chargeable/dischargeable electric power of a rechargeable battery at the timing after elapse of a predetermined period of time when a terminal voltage of the rechargeable battery changes by charging/discharging of the rechargeable battery during the predetermined period of time. The battery control device calculates a specific change amount of the terminal voltage caused by electric charge accumulation in the rechargeable battery after the elapse of the predetermined period of time when the charging/discharging of the rechargeable battery is performed. Further, the battery control device calculates an estimated target value of a current necessary for changing the terminal voltage to a predetermined target voltage or the terminal voltage after the elapse of the predetermined period of time by using the calculated specific change amount, and calculates chargeable/dischargeable electric power on the basis of the calculated estimated target value.

10 Claims, 3 Drawing Sheets

(56) References Cited

U.S. PATENT DOCUMENTS

| | | | |
|---|---|---|---|
| 2004/0008031 A1* | 1/2004 | Arai | H01M 10/48 324/429 |
| 2005/0119856 A1 | 6/2005 | Emori et al. | |
| 2006/0247871 A1 | 11/2006 | Emori et al. | |
| 2007/0159137 A1 | 7/2007 | Verbrugge et al. | |
| 2009/0306915 A1 | 12/2009 | Schoch | |
| 2012/0179435 A1 | 7/2012 | Song et al. | |
| 2012/0215517 A1 | 8/2012 | Bohlen et al. | |

FOREIGN PATENT DOCUMENTS

| | | |
|---|---|---|
| JP | 2010-203935 | 9/2010 |
| JP | 2013-507628 | 3/2013 |
| JP | 2013-205021 | 10/2013 |

\* cited by examiner

BATTERY CONTROL DEVICE

CROSS-REFERENCE TO RELATED APPLICATION

This application is related to and claims priority from Japanese Patent Application No. 2013-254548 filed on Dec. 9, 2013, the contents of which are hereby incorporated by reference.

BACKGROUND OF THE INVENTION

1. Field of the Invention

The present invention relates to battery control devices which perform estimation of a chargeable/dischargeable electric power of a rechargeable battery.

2. Description of the Related Art

For example, when a rechargeable battery mounted on a motor vehicle, i.e. an in-vehicle battery is charged with regenerative power generated by a regenerative power generation process, a battery control device mounted to a motor vehicle estimates a magnitude of a chargeable electric power with which the rechargeable battery is fully charged. In addition, the battery control device estimates a magnitude of a dischargeable electric power to be discharged from the rechargeable battery during a period of supplying an electric power from the rechargeable battery to a main motor mounted on the motor vehicle.

There is a conventional technique, for example a Japanese patent laid open publication No. 2010-203935, discloses an estimation device capable of estimating a magnitude of a chargeable/dischargeable electric power of a rechargeable battery mounted on a motor vehicle. This conventional estimation device estimates a chargeable electric power and a dischargeable electric power of the rechargeable battery on the basis of the assumption that a change amount of a terminal voltage of the rechargeable battery is substantially equal to a change amount of a voltage caused by a current change of a current flowing in the rechargeable battery.

The electric power charging and discharging operation is repeatedly performed in the rechargeable battery mounted on the motor vehicle at predetermined time intervals. During the charging and discharging operation in the predetermined period of time, electric charge is accumulated in the rechargeable battery. That is, when such electric charge is inputted to/outputted from the rechargeable battery through the terminals of the rechargeable battery during the electric power charging/discharging period, a part of the electric charge is accumulated in the rechargeable battery.

During the accumulation of electric charge in the rechargeable battery, a change amount of the terminal voltage of the rechargeable battery contains a first voltage change component and a second voltage change component. That is, the first voltage change component is obtained by a multiplication between an internal resistance value of the rechargeable battery and a current flowing in the rechargeable battery. The second voltage change component is obtained by the accumulation of electric charge in the rechargeable battery. In this case, the conventional technique, for example, Japanese patent laid open publication No. 2010-203935 does not consider the second voltage change component. That is, the conventional technique does not consider the second voltage change component caused by the change amount of electric charge (accumulation of electric charge in or discharging of electric charge from the rechargeable battery. The conventional technique previously described deteriorates an estimation accuracy of the terminal voltage of the rechargeable battery. As a result, the conventional technique has a drawback of it being difficult to estimate a correct amount of a chargeable electric power with which the rechargeable battery is fully charged and a dischargeable electric power of the rechargeable battery mounted on a motor vehicle with high accuracy.

SUMMARY

It is therefore desired to provide a battery control device capable of estimating a correct chargeable/dischargeable electric power of a rechargeable battery with high accuracy.

An exemplary embodiment provides a battery control device having improved structure and operation. The battery control device according to the exemplary embodiment controls charging/discharging of a rechargeable battery during a predetermined period of time and calculates a chargeable/dischargeable electric power of the rechargeable battery after elapse of the predetermined period of time when a terminal voltage of the rechargeable battery has changed due to the charging or discharging of the rechargeable battery. The battery control device has a specific change amount calculation section, an estimated value calculation section and an electric power calculation section. The specific change amount calculation section calculates a specific change amount of a terminal voltage of the rechargeable battery caused by accumulation of electric charge in the rechargeable battery when the terminal voltage of the rechargeable battery is changed during the predetermined period of time in execution of the charging or discharging of the rechargeable battery. The estimated value calculation section calculates an estimated target value by using the specific change amount calculated by the specific change amount calculation section. This estimated target value is one of: a current flowing in the rechargeable battery which is necessary for changing the terminal voltage to a predetermined voltage at a timing after the elapse of the predetermined period of time; and a terminal voltage of the rechargeable battery at the timing after the elapse of the predetermined period of time when the current flows during the predetermined period of time. The electric power calculation section calculates an electric power necessary for charging/discharging of the rechargeable battery on the basis of the estimated target value calculated by the estimated value calculation section.

The battery control device according to the exemplary embodiment controls a magnitude of a current flowing through terminals of the rechargeable battery or a magnitude of a terminal voltage of the rechargeable battery in order to adjust a magnitude of the electric power during the charging/discharging of the rechargeable battery. The charging/discharging of the rechargeable battery is performed by the current flowing in the rechargeable battery. When a magnitude of the current flowing in the rechargeable battery changes, a magnitude of the terminal voltage of the rechargeable battery is also changed.

Even if a voltage change amount $\Delta V$ of the terminal voltage of the rechargeable battery is generated after the elapse of the predetermined period of time, all of the voltage change amount $\Delta V$ of the terminal voltage does not correlate with the current flowing in the rechargeable battery. In other words, a part of the voltage change amount $\Delta V$ of the terminal voltage is caused by a voltage change amount generated by an internal state of the rechargeable battery. This voltage change amount generated by the internal state of the rechargeable battery corresponds to a voltage change amount caused by accumulation of electric charge (i.e. by the charging/discharging of electric charge) in the rechargeable battery.

A conventional battery control device according to a conventional technique obtains an estimated current value and an estimated voltage value without considering any voltage change amount caused by the accumulation of electric charge in the rechargeable battery. Because the conventional battery control device performs the electric power control on the basis of the estimated current amount and the estimated voltage amount without considering a voltage change amount caused by the accumulation of electric charge in the rechargeable battery, it is difficult for the conventional battery control device to perform correct electric power control of the rechargeable battery with high accuracy.

On the other hand, the battery control device according to the exemplary embodiment of the present invention firstly calculates a specific change amount as a voltage change amount of the terminal voltage caused by the accumulation of electric charge in the rechargeable battery during the predetermined period of time when the charging/discharging of the rechargeable battery is performed. The battery control device according to the exemplary embodiment calculates an estimated current value (as an estimated target value) or an estimated voltage value (as an estimated target value) of the terminal voltage by using the calculated specific change amount. In addition, the battery control device according to the exemplary embodiment of the present invention calculates the chargeable/dischargeable electric power of the rechargeable battery on the basis of the estimated target value. This structure of the battery control device according to the exemplary embodiment makes it possible to perform the current estimation or the voltage estimation with high accuracy while considering the specific changed amount as the voltage change amount of the terminal voltage caused by the charging/discharging of electric charge in the rechargeable battery. The battery control device according to the exemplary embodiment performs the correct electric power control on the basis of the estimation result of the terminal voltage of the rechargeable battery. As a result, it is possible for the battery control device according to the exemplary embodiment to calculate the chargeable electric power and the dischargeable electric power with high accuracy.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Figure 1:
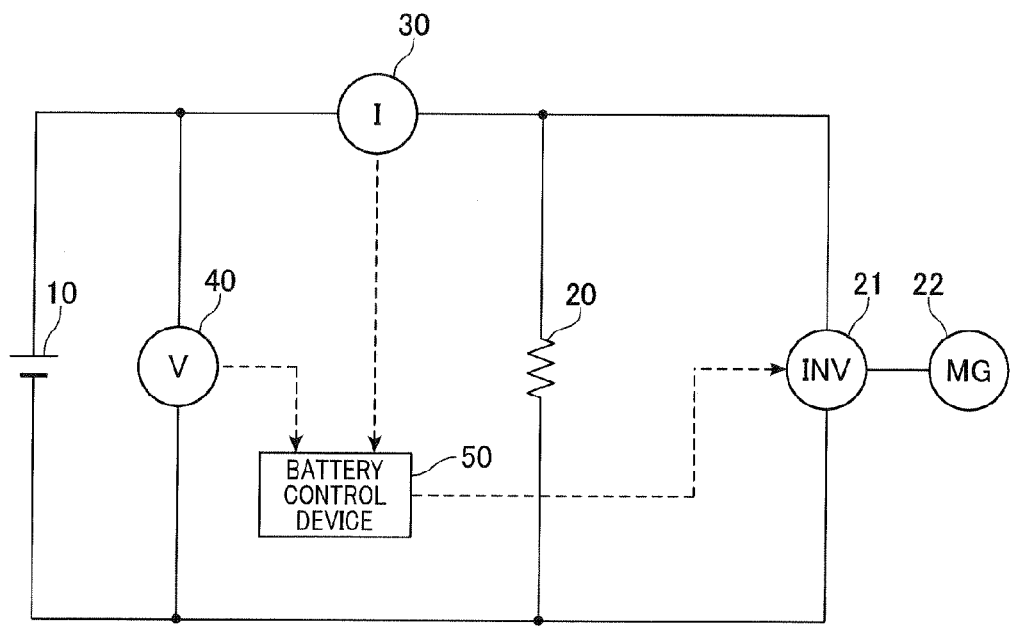
FIG. 1 is a view showing an electric circuit equipped with a rechargeable battery 10 and a battery control device 50 according to an exemplary embodiment of the present invention.

Hereinafter, various embodiments of the present invention will be described with reference to the accompanying drawings. In the following description of the various embodiments, like reference characters or numerals designate like or equivalent component parts throughout the several diagrams.

Exemplary Embodiment

A description will be given of a rechargeable battery 10 or a storage battery and a battery control device 50 performing a control process of an electric power of the rechargeable battery 10 according to an exemplary embodiment with reference to FIG. 1 to FIG. 4.

FIG. 1 is a view showing an electric circuit having the rechargeable battery 10 and the battery control device 50 according to the exemplary embodiment.

As shown in FIG. 1, the rechargeable battery 10 and the battery control device 50 are mounted on a motor vehicle. The rechargeable battery 10 is electrically connected to a motor generator 22 mounted on the motor vehicle through an inverter (INV) 21. The inverter 21 performs an electric power conversion between alternating current and direct current.

When the motor vehicle goes down a slope and supplies kinetic energy to the motor generator 22, the motor generator 22 performs as an electric power generator for generating an electric power. The rechargeable battery 10 is charged with the electric power supplied from the motor generator 22. On the other hand, when the motor vehicle is driving on a road and the motor generator 22 performs as an electric motor for generating rotation energy, the rechargeable battery 10 supplies an electric power to the motor generator 22 to forcedly rotate the motor generator 22.

The rechargeable battery 10 is electrically connected to an electric load 20, and supplies an electric power to the electric load 20. The rechargeable battery 10 is a lithium ion rechargeable battery, for example.

As shown in FIG. 1, a current sensor 30 is arranged on an electric line through which the rechargeable battery 10, the electric load 20 and the inverter 21 are electrically connected together in the motor vehicle. The current sensor 30 detects a current I which flows in the electric line and the rechargeable battery 10. A voltage sensor 40 is arranged at both the terminals of the rechargeable battery 10 and detects a terminal voltage V between both the terminals of the rechargeable battery 10.

Each of the current sensor 30 and the voltage sensor 40 generates a detection signal which corresponds to each of the current I flowing in the rechargeable battery 10 and the terminal voltage V at the terminals of the rechargeable battery 10. Each of the current sensor 30 and the voltage sensor 40 transmits the generated detection signals to the battery control device 50. The battery control device 50 has a detected value acquiring section. The detected value acquiring section in the battery control device 50 receives the detection signals transmitted from the current sensor 30 and the voltage sensor 40, and obtains a detected current value and a detected voltage value corresponding to the received detection signals.

The battery control device 50 calculates a chargeable/dischargeable electric power of the rechargeable battery 10 on the basis of the detected current value obtained from the current sensor 30 and the detected voltage value obtained from the voltage sensor 40 when the charging/discharging operation of the rechargeable battery 10 is initiated.

The chargeable electric power of the rechargeable battery 10 is an electric power with which the rechargeable battery 10 is charged or fully charged when the terminal voltage between both the terminals of the rechargeable battery 10 is adjusted to a predetermined target voltage Vm. Further, the chargeable electric power of the rechargeable battery 10 is an electric power to be charged or fully charged to the rechargeable battery 10 when the current flowing in the rechargeable battery 10 is adjusted to a predetermined target current value Im.

Further, the dischargeable electric power of the rechargeable battery 10 is an electric power to be discharged from the rechargeable battery 10 when the terminal voltage of the rechargeable battery 10 is adjusted to the predetermined target voltage Vm. Still further, the dischargeable electric power of the rechargeable battery 10 is an electric power to be discharged from the rechargeable battery 10 when the current flowing in the rechargeable battery 10 is adjusted to the predetermined target current value Im.

For example, the value of each of the predetermined target voltage Vm and the predetermined target current value Im is determined to avoid occurrence of overcharge and over discharge of the rechargeable battery 10. The battery control device 50 performs the control of the inverter 21 and adjusts the terminal voltage V of the rechargeable battery 10 and the current I flowing in the rechargeable battery 10 on the basis of the chargeable electric power and the dischargeable electric power.

A description will now be given of the method of calculating a chargeable/dischargeable electric power at a timing Ta counted from a start timing of a charging/discharging of the rechargeable battery 10 when the terminal voltage V of the rechargeable battery 10 is changed from a voltage value (zero volt) at a timing t0 (t=0) to the target voltage Vm.

Figure 2:
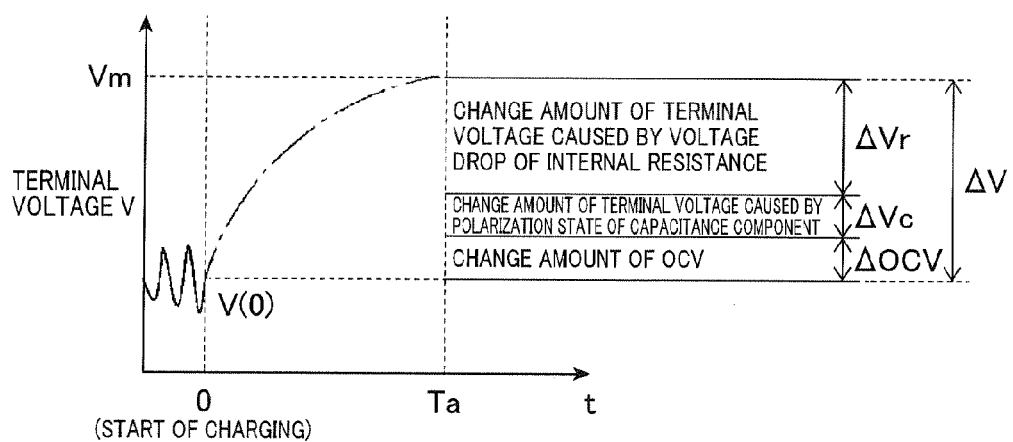
FIG. 2 is a view showing an estimation of a terminal voltage V between both terminals of the rechargeable battery 10 when the rechargeable battery 10 is charged with electric charge.

FIG. 2 is a view showing an estimation of a terminal voltage V between the terminals of the rechargeable battery 10 when the rechargeable battery 10 is charged with electric charge. As shown in FIG. 2, it is possible to express a change amount ΔV of the terminal voltage when the terminal voltage changes from the voltage V(0) to the voltage Vm by using a sum of a change amount ΔVr of the voltage due to the change of the current I, a change amount ΔVc of a polarization voltage of an internal capacity of the rechargeable battery 10 and a change amount ΔOCV of an open circuit voltage of the rechargeable battery 10. That is, the change amount ΔV of the terminal voltage is expressed by the following equation (1):

$$\Delta V = \Delta Vr + \Delta Vc + \Delta OCV \quad (1).$$

A description will now be given of each of the change amount ΔVr of the voltage, the change amount ΔVc of the polarization voltage of the internal capacity of the rechargeable battery 10 and the change amount ΔOCV of the open circuit voltage.

When the terminal voltage V of the rechargeable battery 10 is changed, the current I flowing in the rechargeable battery 10 is also changed. A voltage drop of the internal resistance of the rechargeable battery 10 is changed due to the change of this current I. A change amount ΔVr of the voltage is generated due to the change of the current I. Further, the terminal voltage V of the rechargeable battery 10 is changed due to the change amount ΔVr caused by the change of the current I.

When the current flows in the rechargeable battery 10, the polarization state of the internal capacity which forms the internal resistance of the rechargeable battery 10 is changed. As a result the terminal voltage V of the rechargeable battery 10 is changed. Specifically, the polarization voltage Vc of the internal capacity of the rechargeable battery 10 is changed due to the accumulation of electric charge by charging or the decrease of electric charge by discharging, where the electric charge forms a component of the internal resistance of the rechargeable battery 10. As a result, the terminal voltage V of the rechargeable battery 10 is changed according to the change amount ΔVc of the polarization voltage Vc.

During the period counted to the timing Ta from the start timing when the charging/discharging of the rechargeable battery 10 is initiated, the current I flows in the rechargeable battery 10 in order to charge or discharge the rechargeable battery 10. As a result, a state of charge (SOC) of the rechargeable battery 10 is changed, and the open circuit voltage of the rechargeable battery 10 is also changed due to the change of the SOC of the rechargeable battery 10. Further, the terminal voltage V of the rechargeable battery 10 is changed due to the change amount ΔOCV of the open circuit voltage.

Even if the voltage change ΔV of the terminal voltage V of the rechargeable battery 10 is generated during the predetermined period of time, all of the change amount ΔV of the voltage V does not completely correlate with the current I flowing in the rechargeable battery 10. That is, a part of the change amount ΔV of the voltage V correlates with a change amount of the voltage generated by the change of the internal state of the rechargeable battery 10. The change amount of the voltage corresponds to the change amount (ΔVc, ΔOCV) of the voltage caused by the accumulation of electric charge in the rechargeable battery 10. It is difficult for the battery control device to perform the electric power control with high accuracy when estimating the current I flowing in the rechargeable battery 10 and the terminal voltage V of the rechargeable battery 10 without considering any change amount of the voltage caused by the accumulation of electric charge in the rechargeable battery 10.

It is possible to express the change amount ΔVr by using the following equation (2), which is generated by the change of the current I flowing in the rechargeable battery 10 by using a multiplication of an estimated value ΔI^ of the change amount of the current I and a value Rt(Ta) of the internal resistance of the rechargeable battery 10 (as the internal resistance value Rt) after the elapse of the period Ta (seconds). Through the following description and equations, the hat symbol "^" indicates an estimated value of a parameter.

$$\Delta Vr = \Delta I\hat{}\cdot Rt(Ta) \quad (2).$$

When the detected value of the current I flowing in the rechargeable battery 10, at the timing when the charging/discharging of the rechargeable battery 10 is initiated, the estimated current value I^(Ta), is designated by using I(0), it is possible to express the estimated current value I^(Ta) of the current I flowing in the rechargeable battery 10 at the timing Ta by the following equation (3) and using the equations (1) and (2) previously described.

$$\hat{I}(Ta) = I(0) + \Delta \hat{I} \qquad (3)$$
$$= I(0) + \Delta Vr/Rt(Ta)$$
$$= I(0) + (\Delta V - \Delta Vc - \Delta OCV)/Rt(Ta).$$

That is, the estimated current value $\hat{I}$ (Ta) of the current I flowing in the rechargeable battery 10 can be calculated on the basis of the detected value I(0) of the current at the start timing when the charging/discharging of the rechargeable battery 10 is initiated, the detected value V(0) of the terminal voltage V of the rechargeable battery 10, the change amount $\Delta$OCV of the open circuit voltage, the change amount $\Delta$Vc of the polarization voltage, and the resistance value Rt(Ta) of the internal resistance of the rechargeable battery 10 at the timing Ta.

The polarization voltage Vc is sequentially calculated on the basis of the polarization voltage Vca at a timing before an infinitesimal time $\Delta$t and the current I flowing in the rechargeable battery 10.

A description will now be given of the method of calculating the polarization voltage Vc with reference to FIG. 3.

Figure 3:
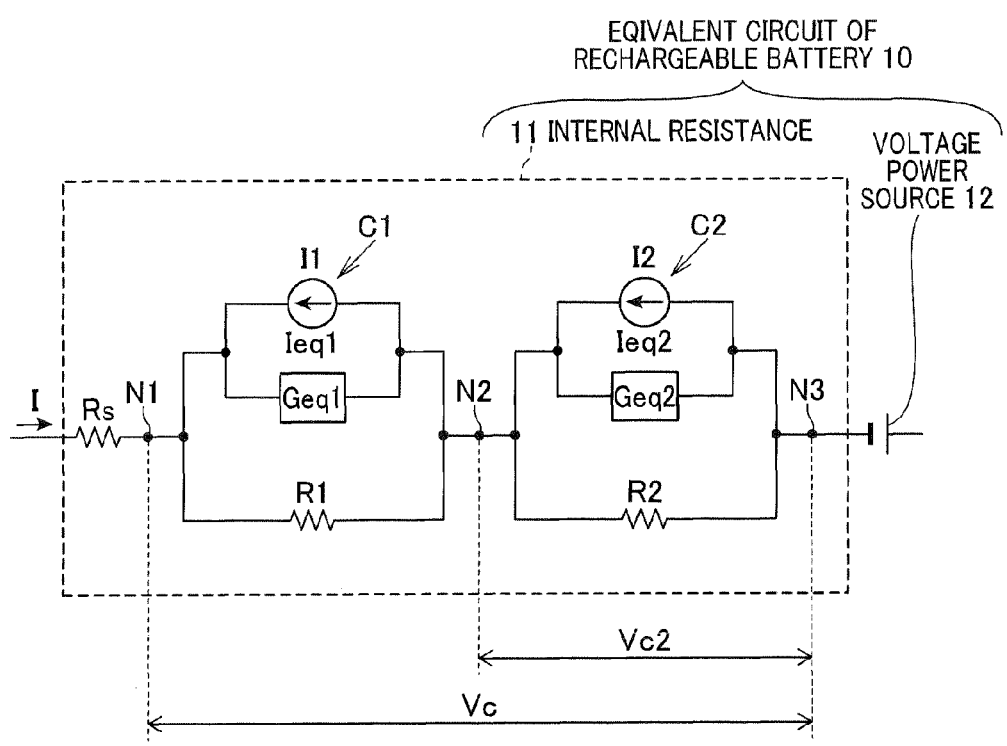
FIG. 3 is a view showing an equivalent circuit of the rechargeable battery 10 which is a control target of the battery control device according to the exemplary embodiment of the present invention.

FIG. 3 is a view showing an equivalent circuit of the rechargeable battery 10. It is possible to calculate the polarization voltage Vc on the basis of the structure of the equivalent circuit shown in FIG. 3.

An internal resistance 11 and a voltage power source 12 are ideal components of, i.e. form the equivalent circuit of the rechargeable battery 10. The internal resistance 11 contains a capacitance component. The output voltage of the voltage power source 12 is equal to a terminal voltage when no current flows in the rechargeable battery 10 during a stable state, i.e. equal to the open circuit voltage.

The equivalent circuit of the rechargeable battery 10 uses a direct current resistance and a response resistance. A resistance value of the direct current resistance does not change even if each of a current value and a voltage value changes. A resistance value of the response resistance changes when each of a current and a voltage changes. Further, the response resistance is composed of a first response resistance and a second response resistance having a different time constant. Each of the first response resistance and the second response resistance corresponds to a different reaction in the rechargeable battery 10. Specifically, the internal resistance 11 has three circuit constants, i.e. the direct current resistance Rs, a first reaction resistance R1 having a capacitance component C1, and a second reaction resistance R2 having a capacitance component C2. The equivalent circuit of the rechargeable battery 10 is a series connection section in which the direct current resistance Rs, the first reaction resistance R1 and the second reaction resistance R2 are connected in series.

When the current I flowing in the rechargeable battery 10 and the terminal voltage V of the rechargeable battery 10 changes, each of the capacitance components C1 and C2 in the first reaction resistance R1 and the second reactance resistance R2 operates as a pseudo resistance. That is, the capacitance components C1 and C2 supply a current flowing in a direction to prevent a change of the current I. The capacitance components C1 and C2 are equivalent to a parallel circuit composed of an electric power source Ieq1, an electric power source Ieq2, a capacitive reactance Geq1 and a capacitive reactance Geq2.

When the current I flows in the rechargeable battery 10, the electric power sources I1 and I2 in the capacitance components C1 and C2 output the current Ieq1 and Ieq2, respectively, in a direction which is opposite to the direction of the current I.

As shown in FIG. 3, through a connection node N1 the direct current resistance Rs is electrically connected to the first reaction resistance R1 having the capacitance component C1. Further, through a connection node N2 the first reaction resistance R1 having the capacitance component C1 is electrically connected to the second reaction resistance R2 having the capacitance component C2. Still further, through a connection node N3 the second reaction resistance R2 having the capacitance component C2 is electrically connected to the voltage power source 12. A voltage Vc between the node N1 and the node N3 is the polarization voltage of an internal capacity of the rechargeable battery 10. The polarization voltage Vc is a sum of a polarization voltage of the capacitance component C1 and a polarization voltage of the capacitance component C2. A voltage Vc2 between the node N2 and the node N3 is the polarization voltage of the capacitance component C2.

The capacitive reactance Geq1 and the capacitive reactance Geq2 can be expressed by the following equations:

$Geq1 = C1/\Delta t$, and $Geq2 = C2/\Delta t$, where $\Delta t$ indicates an infinitesimal time, and C1 and C2 are capacitance components.

The current Ieq1 flowing from the electric power source I1 and the current Ieq2 flowing from the electric power source I2 can be expressed by the following equations:

$Ieq1 = Geq1(Vca - Vc2a)$, and $Ieq2 = Geq2 \cdot Vc2a$, where each of Vca and Vc2a is a voltage at a timing before the infinitesimal time $\Delta t$, and each of Geq1 and Geq2 is the capacitive reactance, respectively.

When Kirchhoff's law is applied to the node N1 shown in FIG. 3 in order to obtain the polarization voltage Vc, the following equation is obtained:

$I = -Ieq1 + Geq1(Vc - Vc2) + (Vc - Vc2)/R1$.

The following equation (4) can be obtained by using the above equation:

$$Vc(1/R1 + Geq1) + Vc2(-1/R2 - Geq1) = I + Ieq1 \qquad (4).$$

The equation (4) can be expressed by the following equation:

$Vc \cdot a11 + Vc2 \cdot a12 = I1$, where $a11 = 1/R1 + Geq1$, $a12 = -1/R1 - Geq1$ and $I1 = Is + Ieq1$.

The following equation (5) can be obtained by using the above equation.

$$Vc = (I1 - Vc2 \cdot a12)/a11 \qquad (5).$$

When Kirchhoff's law is applied to the node N2 shown in FIG. 3 in order to obtain the polarization voltage Vc2, the following equation is obtained:

$Ieq1 - Geq1(Vc - Vc2) - 1/i\ R1(Vc - Vc2) = Ieq2 - Geq2(Vc2) - Vc2/R2$.

This equation can be modified to make the following equation (6).

$$Vc(-1/R1 - Geq1) + Vc2(1/R1 + 1/R2 + Geq1 + Geq2) = -Ieq1 + Ieq2 \qquad (6).$$

The equation (6) can be expressed by the following equation:

$Vc \cdot a21 + Vc2 \cdot a22 = I2$, where $a21 = a12 = -1/R1 - Gq1$, $a22 = 1/R1 + 1/R2 + Geq1 + Geq2$, and $I2 = -Ieq1 + Ieq2$.

Further, the following equation (7) can be obtained by using the above equation and the equation (5) previously described.

$$Vc2=(I2-I1\cdot a21/a11)/(a22-a12\cdot a21/a11) \quad (7).$$

The voltage value Vc2 obtained by the equation (7) is inserted into the equation (5) in order to obtain the polarization voltage Vc.

That is, it is possible for the battery control device 50 to sequentially calculate a value of the polarization voltage Vc in the rechargeable battery 10 at the start timing when the charging/discharging of the rechargeable battery 10 is initiated and an estimated voltage value of the polarization voltage Vc at a future timing on the basic of the circuit constants R1, C1, R2 and C2, the polarization voltage Vca and the voltage Vc2a at a timing before an infinitesimal time Δt, and the detected current I flowing in the rechargeable battery 10.

As previously described in detail, it is possible for the battery control device 50 to calculate the change amount ΔVc of the polarization voltage on the basis of a difference value between the calculated value of the polarization voltage Vc at the start timing of the charging/discharging of the rechargeable battery 10 and the estimated voltage value of the polarization voltage Vc at a forward timing Ta after the start timing of the charging/discharging of the rechargeable battery 10.

A description will now be given of the method of calculating the change amount ΔOCV of an open circuit voltage of the rechargeable battery 10.

The battery control device 50 can calculate the change amount ΔOCV of the open circuit voltage.

On the assumption that the constant current flows in the rechargeable battery 10 during a period counted from the start timing of the charging/discharging of the rechargeable battery 10 to a timing Ta elapsed from the start timing, the battery control device 50 calculates an amount of electric charge accumulated in the battery control device 50. Specifically, the battery control device 50 calculates an amount Af=Im·Ta of electric charge accumulated in the rechargeable battery 10 on the assumption that the target current value Im of the current I flows in the rechargeable battery 10. Further, the battery control device 50 calculates the change amount of the state of charge (SOC) of the rechargeable battery 10 on the basis of the calculated amount Af=Im·Ta of electric charge accumulated in the rechargeable battery 10. The battery control device 50 calculates a change amount ΔOCV of the open circuit voltage of the rechargeable battery 10 on the basis of the calculated change amount of the SOC of the rechargeable battery 10 and a value acquired form a map. This map stores data indicating a relationship between a SOC of and an open circuit voltage of the rechargeable battery 10.

In addition, it is possible for the battery control device 50 to calculate the internal resistance value Rt(Ta) of the rechargeable battery 10 on the basis of the circuit constants Rs, R1, R2, C1 and C2. That is, these circuit constants Rs, R1, R2, C1 and C2 indicate the direct current resistance, the first reaction resistance R1, the second reaction resistance R2, the capacitance component C1 and the capacitance component C2, respectively, as previously explained. Specifically, when a current change occurs in the current I which flows in the rechargeable battery 10, it is possible for the battery control device 50 to calculate the internal resistance value Rt(Ta) of the internal resistance of the rechargeable battery 10 at a timing Ta which has been elapsed from the start timing when the change of the current I is initiated by the following equation (8).

$$Rt(Ta)=Rs+R1(1-\exp(-Ta/\tau 1))+R2(1-\exp(-Ta/\tau 2)) \quad (8),$$

where the time constants $\tau 1 = R1\cdot C1$, and the time constant $\tau 2=R2\cdot C2$. For example, τ1 has approximately 0.01 sec. and τ2 has approximately 10 sec. The direct current resistance Rs has the time constant of zero (0 second) because of having no capacitance component.

The battery control device 50 calculates an estimated current value I^ (Ta) of the current I flowing in the rechargeable battery 10 at the timing Ta on the basis of the change amount ΔVc of the polarization voltage Vc, the change amount ΔOCV of the open circuit voltage of the rechargeable battery 10, and the internal resistance value Rt(Ta) of the internal resistance of the rechargeable battery 10 at the timing Ta. Accordingly, it is possible for the battery control device 50 to calculate the chargeable/dischargeable electric power W(Ta) at the timing Ta of the rechargeable battery 10 on the basis of a multiplication of the target voltage Vm and the estimated current value I^ (Ta),
where W(Ta)=Vm·I^ (Ta).

When the estimated current value I^ (Ta) of the rechargeable battery 10, obtained by the above method, is greater than the target current value Im of the current I flowing in the rechargeable battery 10, the battery control device 50 limits the current I flowing in the rechargeable battery 10 to the target current value Im. In this case, the battery control device 50 also calculates the estimated voltage value V^ (Ta) of the terminal voltage of the rechargeable battery 10 when the current I is limited to the target current value Im.

It is possible for the battery control device 50 to calculate the estimated voltage value V^ (Ta) of the terminal voltage V of the rechargeable battery 10 by adding the detected voltage value V(0) of the terminal voltage V at the start timing T(0) and an estimated value ΔV" of a change amount of the terminal voltage V. (V^ (Ta)=V(0)+ΔV^.)

The estimated value ΔV^ of the change amount of the terminal voltage can be obtained by adding an estimated value ΔVr^ of a change amount of the voltage caused by the change amount of the current I, a change amount ΔOCV of the open circuit voltage and a change amount ΔVc of the polarization voltage of the internal capacity of the rechargeable battery 10. (ΔV"^=ΔVr^+ΔOCV+ΔVc.)

It is possible to calculate the estimated value ΔVr^ of the change amount of the voltage caused by the following equation:

$$\Delta Vr\hat{} = Rt(Ta)\cdot \Delta I = Rt(Ta)\cdot (Im - I(0)).$$

That is, it is possible to calculate the estimated voltage value V^ (Ta) by using the equation of V^ (Ta)=V(0)+Rt(Ta)·(Im−I(0))+ΔOCV+ΔVc. Further, the battery control device 50 calculates the chargeable/dischargeable electric power W(Ta) by a multiplication of the target current value Im and the estimated voltage value V^ (Ta) of the voltage V. (W(Ta)=Im·V^ (Ta)).

Figure 4:
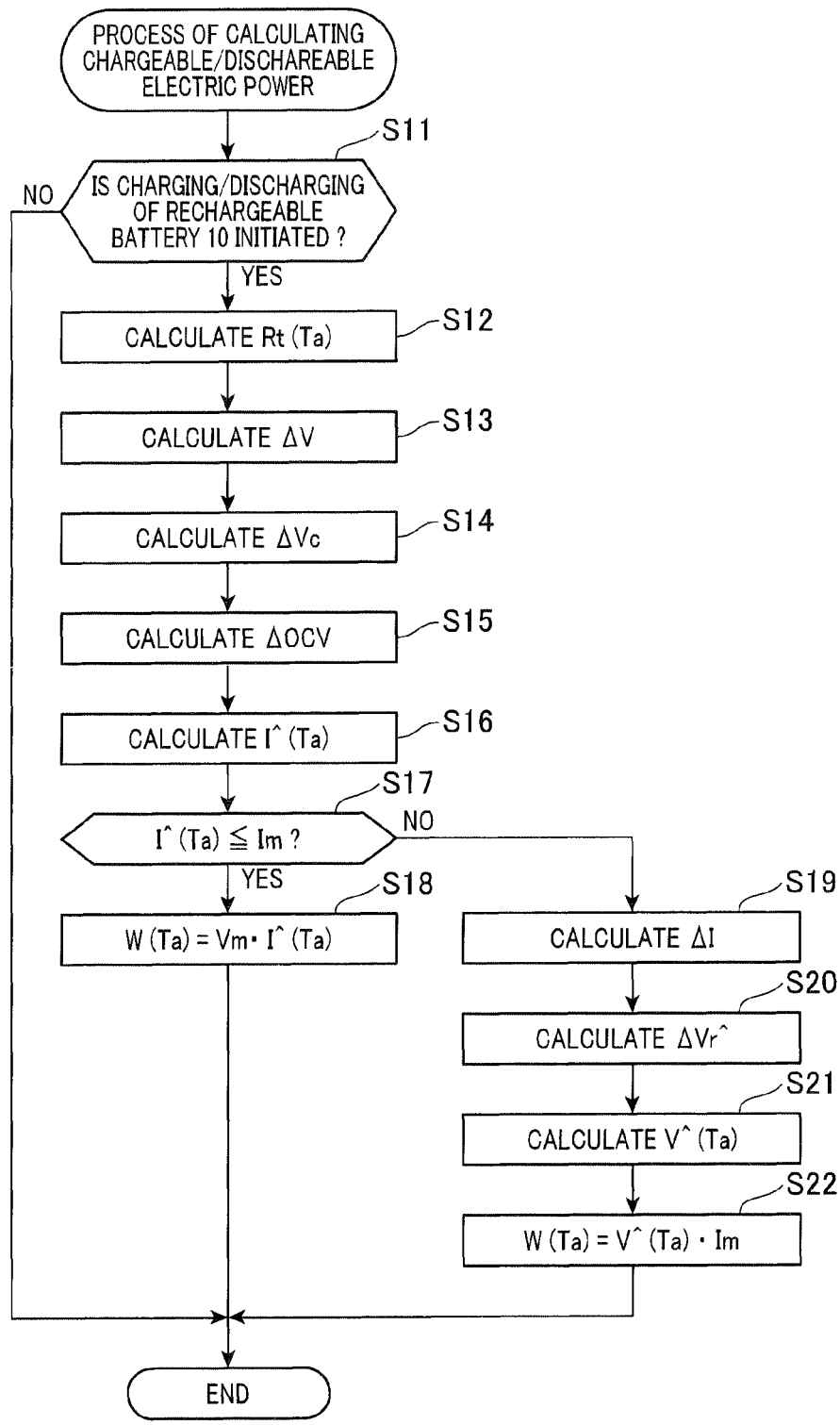
FIG. 4 is a view showing a flow chart of a process of calculating a chargeable/dischargeable electric power performed by the battery control device according to the exemplary embodiment of the present invention shown in FIG. 1.

FIG. 4 is a view showing a flow chart of a process of calculating a chargeable/dischargeable electric power performed by the battery control device 50 according to the exemplary embodiment of the present invention shown in FIG. 1.

The battery control device 50 periodically performs the process of calculating the chargeable/dischargeable electric power of the rechargeable battery 10.

In step S11, the battery control device 50 detects whether or not it is the start timing when one of charging and discharging of the rechargeable battery 10 is initiated.

When the detection result in step S11 indicates negation ("NO" in step S11), i.e. indicates that it is not the start timing to initiate the discharging/discharging of the rechargeable battery 10, the battery control device 50 completes the process shown in FIG. 4.

On the other hand, when the detection result in step S11 indicates affirmation ("YES" in step S11), i.e. indicates that it is the start timing to initiate the discharging/discharging of the rechargeable battery 10, the operation flow goes to step S12.

In step S12, the battery control device 50 calculates an estimated resistance value Rt(Ta) of the internal resistance of the rechargeable battery 10 by using the equation (8). In this case, the battery control device 50 is used as an internal resistance calculation section. The operation flow goes to step S13.

In step S13, the battery control device 50 calculates a change amount $\Delta Vc$, as a specific change amount, of the polarization voltage of the internal capacity of the rechargeable battery 10 and a change amount $\Delta OCV$ of an open circuit voltage of the rechargeable battery 10. The operation flow goes to step S14.

In step S14, the battery control device 50 as a voltage change amount calculation section calculates the change amount $\Delta Vc$ of the polarization voltage of the internal capacity of the rechargeable battery 10 by using the equation (5) and the equation (7). The operation flow goes to step S15.

In step S15, the battery control device 50 calculates a change amount $\Delta OCV$ of the open circuit voltage of the rechargeable battery 10. The change amount $\Delta OCV$ of this open circuit voltage is increased according to charging during the period counted at the start timing of the charging of the rechargeable battery 10 to the timing Ta which is elapsed from the start timing of the charging by Ta seconds. The operation flow goes to step S16.

In step S16, the battery control device 50 calculates an estimated current value $\hat{I}$ (Ta) of the current I flowing in the rechargeable battery 10 at the timing Ta when the terminal voltage V is changed to the target voltage Vm by using the equation (1). The operation flow goes to step S17.

In step S17, the battery control device 50 detects whether or not the estimated current value $\hat{I}$ (Ta) of the current I flowing in the rechargeable battery 10 at the timing Ta is not more than the target current value Im of the rechargeable battery 10.

When the detection result in step S17 indicates affirmation ("YES" in step S17), i.e. indicates that the estimated current value $\hat{I}$ (Ta) of the current at the timing Ta is not more than the target current value Im of the rechargeable battery 10, the operation flow goes to step S18.

In step S18, the battery control device 50 multiplies the target voltage Vm and the estimated current value $\hat{I}$ (Ta) of the current I to obtain the chargeable/dischargeable electric power W(Ta).

(W(Ta)=Vm·$\hat{I}$ (Ta).) The battery control device 50 completes the process shown in FIG. 4.

On the other hand, when the detection result in step S17 indicates negation ("NO" in step S17), i.e. indicates that the estimated current value $\hat{I}$ (Ta) of the current at the timing Ta is more than the target current value Im of the rechargeable battery 10, the operation flow goes to step S19. The battery control device 50 performs a process of step S19 to step S22 in order to calculate the estimated voltage value $\hat{V}$ (Ta) of the terminal voltage V of the rechargeable battery 10.

Specifically, in step S19, the battery control device 50 as a current change amount calculation section calculates a difference current value $\Delta I$ between the detected current value I(0) and the target current value Im, where the detected current value I(0) is detected at the start timing of the charging/discharging of the rechargeable battery 10. The operation flow goes to step S20.

In step S20, the battery control device 50 multiplies the calculated difference current value $\Delta I$ and the internal resistance value R(Ta) to obtain the estimated value $\Delta \hat{Vr}$ of the voltage change when the current I flowing in the rechargeable battery 10 is changed by $\Delta I$ ($\Delta \hat{Vr}=\Delta I \cdot R(Ta)$), where the internal resistance value R(Ta) is a value at the timing Ta which is elapsed by Ta seconds. The operation flow goes to step S21.

In step S21, the battery control device 50 calculates the estimated voltage value $\hat{V}$ (Ta) of the terminal voltage V of the rechargeable battery 10 when the target current value Im flows in the rechargeable battery 10 by adding the detected value V(0) of the terminal voltage V at the start timing of the charging/discharging of the rechargeable battery 10, the value $\Delta \hat{Vr}$, the value $\Delta Vc$ and the value $\Delta OCV$ together. ($\hat{V}$ (Ta)=V(0)+$\Delta \hat{Vr}$+$\Delta Vc$+$\Delta OCV$.) The operation flow goes to step S22.

In step S22, the battery control device 50 (as an electric power calculation section) performs a multiplication of the target current value Im and the estimated voltage value $\hat{V}$ (Ta) of the terminal voltage V of the battery control device 50 in order to obtain the chargeable/dischargeable electric power W(Ta). (W(Ta)=Im·$\hat{V}$ (Ta).)

A description will now be given of the effects of the battery control device 50 according to the exemplary embodiment.

The rechargeable battery 10 having the structure previously described calculates the specific change amounts $\Delta Vc$ and the $\Delta OCV$ as the change amount $\Delta V$ of the terminal voltage V of the rechargeable battery 10 when the charging/discharging of the rechargeable battery 10 is performed, where the specific change amounts $\Delta Vc$ and the $\Delta OCV$ indicate the change amount of the terminal voltage V when the electric charge are charged in the rechargeable battery 10 or the electric charge are discharged from the rechargeable battery 10. Further, the battery control device 50 calculates, as estimated target values, the estimated current value $\hat{I}$ (Ta) of the current I or the estimated voltage value $\hat{V}$ (Ta) of the terminal voltage V of the rechargeable battery 10 by using the specific change amounts $\Delta Vc$ and the $\Delta OCV$.

Still further, the battery control device 50 calculates the chargeable/dischargeable electric power on the basis of the estimated current value $\hat{I}$ (Ta) and the estimated voltage value $\hat{V}$ (Ta) of the terminal voltage V of the rechargeable battery 10. In this case, it is possible for the battery control device 50 to perform the estimation of the current I flowing in the rechargeable battery 10 and the terminal voltage V of the rechargeable battery 10 while considering the specific change amounts $\Delta Vc$ and $\Delta OCV$ as the voltage change components caused by charging and discharging of electric charge in the rechargeable battery 10. This makes it possible to calculate the chargeable/dischargeable electric power with high accuracy.

Specifically, the battery control device 50 subtracts the specific change amount from a difference value between the detected value V (0) and the target voltage value Vm of the terminal voltage V of the rechargeable battery 10 in order to obtain the voltage change value $\Delta Vr$ due to the change amount of the current I when the terminal voltage V of the rechargeable battery 10 to the target voltage Vm.

Further, the battery control device 50 adds to the detected current value I(0) the value obtained by dividing the change amount ΔVr of the terminal voltage V due to the calculated change amount of the current I by the internal resistance value Rt(Ta). It is further possible for the battery control device 50 to calculate the estimated current value Î (Ta) of the current I on the basis of the added value with high accuracy when the terminal voltage V of the rechargeable battery 10 is changed to the target voltage Vm. Still further, it is possible for the battery control device 50 to calculate the chargeable/dischargeable electric power with high accuracy by using the estimated current value Î (Ta) of the current I to being flowing in the rechargeable battery 10.

In a case in which the battery control device 50 calculates the estimated voltage value V̂ (Ta) of the terminal voltage V of the rechargeable battery 10, the battery control device 50 calculates a difference value between the detected current value of the current I flowing in the rechargeable battery 10 and the target current value Im. The battery control device 50 calculates the estimated value ΔVr̂ of the change amount of the terminal voltage V when the current I is changed by the calculated difference value.

Further, the battery control device 50 calculates the estimated voltage value V̂ (Ta) of the terminal voltage V of the rechargeable battery 10 on the basis of the predicted value ΔVr̂ of the change amount of the terminal voltage V, the specific change amount ΔVc and the specific change amount ΔOCV with high accuracy.

Because the equivalent circuit of the rechargeable battery 10 contains a capacitance component, the capacitance component of the rechargeable battery 10 accumulates electric charge. When a current flows in the rechargeable battery 10, the accumulated amount of electric charge in the rechargeable battery 10 is changed, and as a result, a polarization voltage of an internal capacity as the capacity component of the rechargeable battery 10 is changed due to the accumulated amount of these electric charge. The rechargeable battery 10 calculates the change amount ΔVc of the polarized voltage in the rechargeable battery 10 while considering the change of the polarization state of the rechargeable battery 10. The battery control device 50 performs the process of estimating the terminal voltage of the rechargeable battery 10 and the current flowing in the rechargeable battery 10 by using the calculated change amount ΔVc of the polarization voltage of the internal capacity of the rechargeable battery 10. This makes it possible to calculate the chargeable/dischargeable electric power of the rechargeable battery 10 with high accuracy on the basis of these estimated values.

When the charging or discharging of the rechargeable battery 10 is performed, positive electric charge or negative electric charge is accumulated in the rechargeable battery 10. The accumulation of electric charge increases or decreases an open circuit voltage of the rechargeable battery 10 as the electric power source. Accordingly, the battery control device 50 calculates the change amount ΔOCV of the open circuit voltage of the rechargeable battery 10 as one of the specific change amount values, and estimates the voltage V and the current I on the basis of the calculated change amount ΔOCV of the rechargeable battery 10. This structure and operation of the battery control device 50 makes it possible to calculate the chargeable/dischargeable electric power of the rechargeable battery 10 with high accuracy.

When the terminal voltage V of the rechargeable battery 10 or the current I flowing in the rechargeable battery 10 is changed, the internal resistance value Rt(t) is changed due to the change of the terminal voltage V or the current I. The battery control device 50 calculates the internal resistance value R(t) of the rechargeable battery 10 at a predetermined timing such as the timing Ta elapsed from a specific timing, for example, the start timing when the charging/discharging of the rechargeable battery 10 is initiated. The battery control device 50 estimates the current and the terminal voltage of the rechargeable battery 10 at the predetermined timing such as the timing Ta with high accuracy on the basis of the calculated internal resistance value Rt(Ta) at the timing Ta.

The battery control device 50 judges whether or not the estimated current value Î (Ta) of the current I, when the terminal voltage V of the rechargeable battery 10 is changed to the target voltage Vm, becomes more than the target current value Im of the current I flowing in the rechargeable battery 10. When the judgment result indicates affirmation, i.e. indicates that the estimated current value Î (Ta) of the current I become more than the target current value Im of the current I flowing in the rechargeable battery 10 (in other words, when the current I flowing in the rechargeable battery 10 is limited to the target current value I) the battery control device 50 calculates the estimated voltage value V̂ (Ta) of the terminal voltage T of the rechargeable battery 10 when the target current value Im flows in the rechargeable battery 10. This structure and operation of the battery control device 50 makes it possible to calculate chargeable/dischargeable electric power of the rechargeable battery 10 with high accuracy while the current I flowing in the rechargeable battery 10 is limited to the target current value Im.

(Other Modifications)

A description will now be given of various modifications of the battery control device 50 according to the exemplary embodiment of the present invention. The battery control device 50 calculates both a chargeable electric power and a dischargeable electric power of the rechargeable battery 10. However, the concept of the present invention is not limited by the exemplary embodiment. For example, it is possible for the battery control device 50 to calculate one of a chargeable electric power and a dischargeable electric power of the rechargeable battery 10.

The exemplary embodiment previously described shows the following calculation process. When the estimated current value Î (Ta) of the current I is more than the target current value Im, it is possible for the battery control device 50 according to the exemplary embodiment to calculate the estimated voltage value V̂ (Ta) of the terminal voltage V of the rechargeable battery 10 at the timing when the current I flowing in the rechargeable battery 10 is changed to the target current value Im. However, the concept of the present invention is not limited by the exemplary embodiment previously described. For example, it is possible for the battery control device 50 to avoid this calculation process.

Further, when the estimated current value Î (Ta) of the current I becomes more than a predetermined current value which is different from the target current value Im, it is possible for the battery control device 50 to calculate the estimated voltage value V̂ (Ta) of the terminal voltage V of the rechargeable battery 10 at the timing when the current I is changed to the target current value Im.

Still further, the battery control device 50 calculates the estimated voltage value V̂ (Ta) of the terminal voltage V when the current I is changed to the target current value Im. When the estimated voltage value V̂ (Ta) becomes more than the target voltage value Vm, it is possible for the battery control device 50 to calculate the estimated current value Î

(Ta) of the current I flowing in the rechargeable battery 10 at the timing when the terminal voltage V is changed to the target voltage.

The battery control device 50 according to the exemplary embodiment previously described uses, as one of the specific parameters, a sum of the change amount ΔVc of the polarization voltage of the internal capacity of the rechargeable battery 10 and the change amount ΔOCV of the open circuit voltage of the rechargeable battery 10. However, the concept of the present invention is not limited by the exemplary embodiment. For example, it is possible for the battery control device 50 to use, as the specific change amount, one of the change amount ΔVc of the polarization voltage of the internal capacity of the rechargeable battery 10 and the change amount ΔOCV of the open circuit voltage of the rechargeable battery 10.

The battery control device 50 according to the exemplary embodiment previously described uses the internal resistance value 11 of the rechargeable battery 10 which is changed according to the elapse of time. However, the concept of the present invention is not limited by the exemplary embodiment. For example, it is possible for the battery control device 50 to use a constant value of the internal resistance value 11 which does not change according to an elapse of time.

The battery control device 50 according to the exemplary embodiment previously described calculates the chargeable/dischargeable electric power at the timing when the charging/discharging is initiated. However, the concept of the present invention is not limited by the exemplary embodiment. For example, it is possible for the battery control device 50 to calculate the charging/discharging electric power every predetermined period of time when the charging/discharging of the rechargeable battery 10 is performed.

The battery control device 50 according to the exemplary embodiment previously described uses the equivalent circuit of the rechargeable battery 10 having a series connection structure composed of the internal resistance 11 and the direct current resistance of the rechargeable battery 10. However, the concept of the present invention is not limited by the exemplary embodiment. For example, it is possible for the battery control device 50 to use another equivalent circuit composed of a direct current resistance and a reaction resistance connected in series or composed of reaction resistances connected in series without having a direct current resistance.

The battery control device 50 according to the exemplary embodiment previously described uses the target voltage value Vm and the target current value Im which prevent overcharge and over discharge of the rechargeable battery 10. However, the concept of the present invention is not limited by the exemplary embodiment. For example, it is possible for the battery control device 50 to use another target voltage value and another target current value. For example, it is possible to determine and use another target voltage on the basis of the drive voltage of the electric load 20 or the conversion capability of the inverter 21 for converting a direct current to an alternating current.

The exemplary embodiment uses a lithium ion battery as the rechargeable battery 10. However, the concept of the present invention is not limited by the exemplary embodiment. For example, it is possible to use a lead acid battery or a nickel metal hydride battery.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A battery control device configured to control a charging/discharging of a rechargeable battery during a predetermined period of time, and calculate a chargeable/dischargeable electric power of the rechargeable battery at a timing after elapse of the predetermined period of time when a terminal voltage of the rechargeable battery has changed due to the charging/discharging of the rechargeable battery, wherein the battery control device comprises:

a specific change amount calculation section configured to calculate a specific change amount of a terminal voltage of the rechargeable battery caused by accumulation of electric charge in the rechargeable battery when the terminal voltage of the rechargeable battery is changed during the predetermined period of time in execution of the charging or discharging of the rechargeable battery;

an estimated value calculation section configured to calculate an estimated target value by using the specific change amount calculated by the specific change amount calculation section, where the estimated target value is one of a current flowing in the rechargeable battery necessary for changing the terminal voltage to a predetermined voltage at a timing after the elapse of the predetermined period of time and the terminal voltage of the rechargeable battery at the timing after the elapse of the predetermined period of time when the current flows during the predetermined period of time; and an electric power calculation section configured to calculate an electric power necessary for charging/ discharging of the rechargeable battery on the basis of the estimated target value calculated by the estimated value calculation section;

a detected value acquiring section configured to acquire a detected value outputted from a voltage detection section for detecting the terminal voltage of the rechargeable battery and a detected value outputted from a current detection section; and a voltage change amount calculation section configured to calculate a voltage change amount of the terminal voltage of the rechargeable battery which is a difference between a detected value of the terminal voltage of the rechargeable battery at a start timing of the predetermined period of time and the target voltage value of the terminal voltage of the rechargeable battery after the elapse of the predetermined period of time;

wherein the estimated value calculation section comprises an estimated current value calculation section configured to calculate, as an estimated target value, an estimated current value of the current flowing in the rechargeable battery on the basis of a voltage value obtained by subtracting or adding the specific change amount of the voltage calculated by the specific change amount calculation section, the internal resistance value of the rechargeable battery and the detected current value of the current flowing in the rechargeable battery;

the battery control device further comprises:

a judgment section configured to judge whether or not the estimated current value of the current calculated by the estimated current value calculation section is more than a predetermined target current value; and a current change amount calculation section configured to calculate a change amount of the current which is a difference between a detected value of the current at the start timing of the predetermined period of time and the target current value;

wherein the estimated value calculation section comprises a estimated voltage value calculation section configured to calculate, as an estimated target value, an estimated voltage value of the terminal voltage by subtracting or adding a change amount of the terminal voltage, a specific changed amount calculated by the specific change amount calculation section, and a detected voltage value of the terminal voltage;

where the change amount of the voltage generated when the current flowing in the internal resistance of the rechargeable battery is obtained by multiplying the current change amount of the current and the internal resistance value of the rechargeable battery at a timing when the judgment result of the judgment section indicates that the estimated current value calculated by the estimated current value calculation section is more than the predetermined target current value.

2. The battery control device according to claim 1, wherein the battery control device uses an equivalent circuit of the rechargeable battery having capacitance components when calculating a chargeable/ dischargeable electric power of the rechargeable battery, and the specific change amount calculation section calculates the specific change amount on the basis of a change amount of a polarization state of the capacitance components in the equivalent circuit of the rechargeable battery.

3. The battery control device according to claim 2, wherein the specific change amount calculation section calculates a change amount of a state of charge (SOC) of the rechargeable battery which is changed by flowing the current in the rechargeable battery, and the specific change amount calculation section calculates a change amount of an open circuit voltage of the rechargeable battery on the basis of the calculated change amount of the SOC, and calculates the specific change amount on the basis of the change amount of the open circuit voltage.

4. The battery control device according to claim 2, wherein the current change amount calculation section calculates the change amount of the current which is a difference between the detected value of the current at the start timing of the predetermined period of time and the target current value after the elapse of the predetermined period of time.

5. The battery control device according to claim 1, wherein the specific change amount calculation section calculates a change amount of a state of charge (SOC) of the rechargeable battery which is changed by flowing the current in the rechargeable battery, and the specific change amount calculation section calculates a change amount of an open circuit voltage of the rechargeable battery on the basis of the calculated change amount of the SOC, and calculates the specific change amount on the basis of the change amount of the open circuit voltage.

6. The battery control device according to claim 5, wherein the current change amount calculation section calculates the change amount of the current which is a difference between the detected value of the current at the start timing of the predetermined period of time and the target current value after the elapse of the predetermined period of time.

7. The battery control device according to claim 1, wherein the current change amount calculation section calculates the change amount of the current which is a difference between the detected value of the current at the start timing of the predetermined period of time and the target current value after the elapse of the predetermined period of time.

8. The battery control device according to claim 7, further comprising an internal resistance calculating section configured to calculate an estimated resistance value of the internal resistance of the rechargeable battery which changes due to a change of the terminal voltage or the current of the rechargeable battery during the predetermined period of time on the basis of circuit constants forming an equivalent circuit of the rechargeable battery and a time elapse during the predetermined period of time, wherein the estimated value calculation section calculates an estimated target value by using the internal resistance value of the rechargeable battery after the elapse of the predetermined period of time calculated by the internal resistance calculating section.

9. The battery control device according to claim 1, further comprising an internal resistance calculating section configured to calculate an estimated resistance value of the internal resistance of the rechargeable battery which changes due to a change of the terminal voltage or the current of the rechargeable battery during the predetermined period of time on the basis of circuit constants forming an equivalent circuit of the rechargeable battery and a time elapse during the predetermined period of time, wherein the estimated value calculation section calculates an estimated target value by using the internal resistance value of the rechargeable battery after the elapse of the predetermined period of time calculated by the internal resistance calculating section.

10. The battery control device according to claim 1, further comprising an internal resistance calculating section configured to calculate an estimated resistance value of the internal resistance of the rechargeable battery which changes due to a change of the terminal voltage or the current of the rechargeable battery during the predetermined period of time on the basis of circuit constants forming an equivalent circuit of the rechargeable battery and a time elapse during the predetermined period of time, wherein the estimated value calculation section calculates an estimated target value by using the internal resistance value of the rechargeable battery after the elapse of the predetermined period of time calculated by the internal resistance calculating section.

* * * * *